United States Patent
Choi et al.

(10) Patent No.: US 7,292,068 B2
(45) Date of Patent: Nov. 6, 2007

(54) OUTPUT DRIVER FOR USE IN SEMICONDUCTOR DEVICE

(75) Inventors: Myung-Han Choi, Yongin-si (KR); Hwa-Jin Kim, Seoul (KR); Young-Dae Lee, Seoul (KR)

(73) Assignee: Samsung Electronics Co., Ltd. (KR)

( * ) Notice: Subject to any disclaimer, the term of this patent is extended or adjusted under 35 U.S.C. 154(b) by 263 days.

(21) Appl. No.: 11/031,723

(22) Filed: Jan. 7, 2005

(65) Prior Publication Data
US 2005/0151561 A1 Jul. 14, 2005

(30) Foreign Application Priority Data
Jan. 13, 2004 (KR) .................... 10-2004-0002137

(51) Int. Cl.
*H03K 19/0175* (2006.01)
(52) U.S. Cl. .................... 326/83; 326/87; 326/26
(58) Field of Classification Search .................... 326/27, 326/30, 82–87
See application file for complete search history.

(56) References Cited

U.S. PATENT DOCUMENTS

| | | | | |
|---|---|---|---|---|
| 4,829,199 A | * | 5/1989 | Prater | 326/27 |
| 5,122,690 A | * | 6/1992 | Bianchi | 326/87 |
| 5,382,847 A | * | 1/1995 | Yasuda | 326/68 |
| 5,389,834 A | * | 2/1995 | Kinugasa et al. | 326/21 |
| 5,877,647 A | * | 3/1999 | Vajapey et al. | 327/391 |
| 6,137,317 A | * | 10/2000 | Griffin | 326/87 |
| 6,184,730 B1 | * | 2/2001 | Kwong et al. | 327/112 |
| 6,198,307 B1 | | 3/2001 | Garlepp et al. | 326/83 |
| 6,351,172 B1 | | 2/2002 | Ouyang et al. | 327/333 |
| 6,362,655 B1 | * | 3/2002 | Abraham et al. | 326/83 |
| 6,509,765 B1 | * | 1/2003 | Drost | 327/112 |
| 6,924,669 B2 | * | 8/2005 | Itoh et al. | 326/87 |

* cited by examiner

*Primary Examiner*—Don Le
(74) *Attorney, Agent, or Firm*—Mills & Onello LLP

(57) ABSTRACT

There is provided an output driver for use in a semiconductor device capable of remarkably improving linearity of impedance by reducing or minimizing a change of an impedance for output data caused due to a change of an external power supply. The output driver for outputting internal data of a semiconductor device to the exterior of a chip comprises a first driving section including a driving transistor to maintain an impedance for applied data at a certain level in response to the data; and a second driving section for compensating for linearity of the impedance in response to an operation signal from the driving transistor of the first driving section and providing an output terminal with the data.

14 Claims, 5 Drawing Sheets

OUTPUT DRIVER FOR USE IN SEMICONDUCTOR DEVICE

CROSS-REFERENCE TO RELATED APPLICATION

This application claims the benefit of Korean Patent Application No. 2004-2137, filed on Jan. 13, 2004, the contents of which are hereby incorporated herein by reference in their entirety.

BACKGROUND

1. Technical Field

The present invention relates to a semiconductor device and, more particularly, to an output driver for use in a semiconductor device capable of outputting internal data of the semiconductor device to the exterior of a chip.

2. Discussion of the Related Art

Semiconductor devices, such as microcomputers, memory devices, gate arrays and the like, are used in a variety of electrical products such as personal computers, workstations and the like. Such semiconductor devices have input/output pins for transmitting and receiving data to and from external circuits, and an output circuit for providing internal data to external circuits, for example, an output buffer and an output driver circuit. When the semiconductor devices are incorporated in the electrical products, the input/output pins are connected to a transmission line such as a printed wiring on a mounted substrate, and the internal data of the semiconductor device is provided to other semiconductor devices through the transmission line as an interface. In this case, in order that output data of the semiconductor device is optimally transmitted via the transmission line, matching between an output impedance of the input/output pins and an impedance of the transmission line should be performed.

In particular, for a semiconductor device requiring a high-speed operation such as an SRAM (Static Random Access Memory), small swing to reduce a swing width of a signal is employed in order to minimize a delay time required for signal delivery and to reduce consumption power. However, as the swing width of the signal is reduced, an effect due to an external noise increases and reflection of an output signal due to impedance mismatching in an interface stage becomes critical. The impedance mismatching is caused by an external noise or a change of power supply voltage, a change of operating temperature, a change of manufacturing process, or the like. Occurrence of impedance mismatching makes high-speed data transmission difficult and may distort a signal outputted from a data output terminal of, the semiconductor device, namely, output data. Accordingly, if a semiconductor device at a receiving side receives the distorted output signal at its input, it causes problems, such as setup/hold fail, determination miss for an input level, or the like.

Hereinafter, configurations and operations of an impedance control circuit and an output circuit for use in a semiconductor memory device will be discussed, in connection with an output driver for use in a semiconductor device in accordance with prior art.

FIG. 1 is a block diagram showing an impedance control circuit (ZQ circuit) and an output circuit for use in a semiconductor device, and FIG. 2 is a circuit diagram showing an output driver for use in a semiconductor device in accordance with prior art. The configuration and operation of the impedance control circuit for use in the semiconductor device will be briefly described with reference to FIGS. 1 and 2.

The impedance control circuit in FIG. 1 is composed of an impedance detector 110, an impedance comparator 120, a counter 130, a high-level code selector (HCS) 140, and a ZQ driver 150. The output circuit is composed of a data output buffer 160 and an off-chip driver 170 that is an output driver. An external resistor RZQ having a resistance value of about five times the impedance value of an external device is connected between an extra pad ZQPAD of the impedance detector 110 and ground, and the impedance ZQ detector 110 outputs a pad voltage ZQPAD and a reference voltage REFIO. Generally, a level of the reference voltage REFIO is preset to a level of half the output power supply voltage VDDQ/2. The impedance comparator 120 compares the level of the reference voltage REFIO with the level of the pad voltage ZQPAD, and outputs a resultant up-down control signal UDZQ. The counter 130 performs up or down counting in response to the up-down control signal UDZQ, and outputs a control code data CTQx for selectively, placing a MOS array composed of a plurality of MOS transistors at a turn-on or off state. Also, the counter 130 performs a counting operation that increases or decreases the control code data CTQx until the level of the reference voltage REFIO and the level of the pad voltage ZQPAD become the same. Accordingly, the selected MOS transistors are turned on or off, such that the level of the reference voltage REFIO and the level of the pad voltage ZQPAD become identical. In this case, the reference voltage REFIO and the pad voltage ZQPAD become at the same level of VDDQ/2, and a turn-on resistance value of the MOS array and a resistance value of the external resistance RZQ become identical with each other. Consequently, transistors in the off-chip driver 170 are turned on as MOS transistors in the MOS array that are determined to be turned on, resulting in the match of the output impedance with an external impedance. The high-level code selector 140 outputs high-level control code data CTQDx by selecting high-level control code data from a plurality of control code data CTQx that are received in the impedance matching process. The ZQ driver 150 generates driving code data CZQx in response to the selected control code data CTQDx and provides the data to the data output buffer 160 when the off-chip driver 170 is in a high impedance state. Accordingly, previous driving code data CZQx is newly updated according to a change of the selected control code data CTQDx. The updated driving code data CZQx is applied to the data output buffer 160, and only a unit buffer selected from unit buffers in the data output buffer 160 is enabled in response to the updated driving code data CZQx. Accordingly, the enabled unit buffer in the data output buffer 160 receives DATA/DATAB being internal data to be outputted to the exterior, generates pull-up output data DOUx and pull-down output data DODx, and applies them to the off-chip driver 170. Accordingly, a signal level of final output data is determined by the selected transistors in the off-chip driver 170 and is provided to the exterior via the output terminal DQ. An output impedance value for the output data becomes identical with an impedance of an external device through the above-stated impedance control process, thus achieving the impedance matching.

As shown in FIG. 2, the off-chip driver 170 is composed of a pull-up driving section including a first PMOS and a first NMOS transistors 172 and 174 for determining a state of a first node N1 in response to pull-up output data DOUx and a pull-up driving transistor 180 operating according to the state of the first node N1; and a pull-down driving section including a second PMOS and a second NMOS transistors 176 and 178 for determining a state of a second node N2 in response to a pull-down output data DODx and a pull-down driving transistor 182 operating according to the state of the second node N2. The pull-up driving transistor 180 is connected between a third node N3 and an external power supply VDDQ, and is turned on when the first node N1 is in a "L" state, serving to provide an output terminal with the output data. Further, the pull-down driving transistor 182 is connected between a third node N3 and a ground power supply VSSQ, and is turned on when the second node N2 is in a "H" state, serving to provide the output terminal with the output data.

The external power supply VDDQ of the output driver in accordance with the above-described prior art is provided in a voltage level lower than that used by other circuits in a chip in order to embody a small swing interface. In this case, a problem arises in that the external power supply voltage VDDQ provided to an output driver changes with a change of the external voltage, and in turn, an impedance for the output data changes correspondingly. Therefore, since the output data is distorted and outputted, problems arise, such as a setup/hold fail, determination miss for an input level, and the like when the external device receives the distorted output signal.

SUMMARY OF THE INVENTION

A feature of the present invention, therefore, is to provide an output driver for use in a semiconductor device capable of remarkably reducing an impedance change for output data by including a first driving section of a diode type which compensates for the impedance change for the output data caused by a change of an external power supply voltage.

Another feature of the present invention is to provide an output driver for use in a semiconductor device capable of reducing an impedance change without remarkably increasing capacitance, reducing a size of an output driver by including a second driving section of a resistor type which can be formed with a small size, and reducing the impedance change over all regions without increasing capacitance of the output driver, compared with prior art.

Still another feature of the present invention is to provide an output driver for use in a semiconductor device capable of remarkably improving linearity of impedance by minimizing the impedance change for the output data without increasing capacitance of the output driver.

According to an aspect of the present invention, there is provided an output driver for outputting internal data of a semiconductor device to the exterior of a chip, comprising a first driving section including a driving transistor to maintain an impedance for applied data at a first level in response to the data; and a second driving section for compensating for linearity of the impedance in response to an operation signal from the driving transistor of the first driving section and providing an output terminal with the data.

Further, the first driving section can include a diode device for maintaining an impedance of output data dependent on a change of an output voltage at a second level, and the second driving section includes a resistor device for compensating for linearity of the impedance in response to an operation signal from a driving transistor of the first driving section.

Further, the first driving section can include a first pull-up driving section for maintaining the impedance of applied pull-up output data at a level in response to the pull-up output data; and a first pull-down driving section for maintaining an impedance of applied pull-down output data at a level in response to the pull-down output data.

The second driving section can include a second pull-up driving section for compensating for linearity of the impedance in response to a state of the fourth node of the first driving section and providing the output terminal with the data, and a second pull-down driving section for compensating for linearity of the impedance in response to a state of the fifth node of the first driving section and providing the output terminal with the data.

In one embodiment, the second pull-up driving section includes: a PMOS transistor connected between the sixth node and the external power supply and operating in response to the state of the fourth node of the first driving section; and a first resistor device connected between the third node connected to the output terminal and the fifth node.

The second pull-down driving section can include: an NMOS transistor connected between the sixth node and the ground power supply and operating in response to the state of the fifth node of the first driving section; and a second resistor device connected between the third node connected to the output terminal and the seventh node.

In one embodiment, the semiconductor device is an SRAM device.

In one embodiment, the output driver is an off-chip driver for providing the output terminal with output data of a ZQ circuit applied for impedance matching of the semiconductor device.

In one embodiment, the first pull-up driving section includes: a first PMOS transistor connected between a first node and an external power supply and operating in response to the applied pull-up output data; a first NMOS transistor connected between the first node and a ground power supply and operating in response to the applied, pull-up output data; a third PMOS transistor connected between a third node connected to an output terminal and the external power supply and operating in response to a state of the first node; a fourth PMOS transistor connected between a fourth node and the external power supply and operating in response to the applied pull-up output data; a fourth NMOS transistor connected between the fourth node and the third node and operating in response to the applied pull-up output data; and a sixth PMOS transistor connected between the third node and the external power supply and operating in response to a state of the fourth node.

In one embodiment, the first pull-down driving section includes: a second PMOS transistor connected between the second node and the external power supply and operating in response to the applied pull-down output data; a second NMOS transistor connected between the second node and the ground power supply and operating in response to the applied pull-down output data; a third NMOS transistor connected between the output terminal and the ground power supply and operating in response to a state of the second node; a fifth PMOS transistor connected between the fifth node and the third node and operating in response to the applied pull-down output data; a fifth NMOS transistor connected between the fifth node and the ground power supply and operating in response to the pull-down output data; and a sixth NMOS transistor connected between the third node and the ground power supply and operating in response to a state of the fifth node.

In one embodiment, the second driving section includes a resistor device for compensating for linearity of the impedance in response to an operation signal from the driving transistor of the first driving section.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE INVENTION

Figure 1:
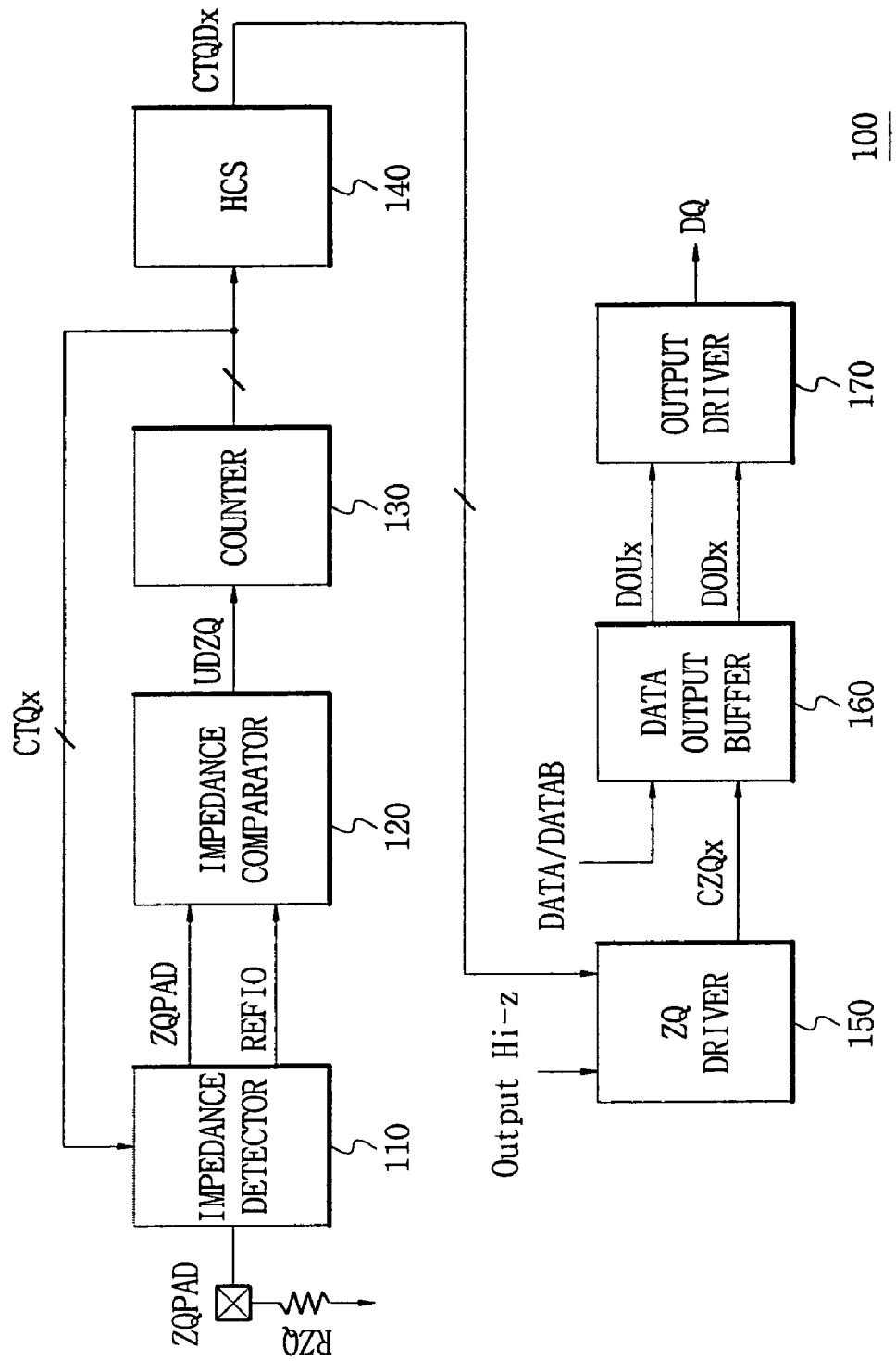
FIG. 1 is a block diagram showing an impedance control circuit and an output circuit for use in a semiconductor device.
Figure 2:
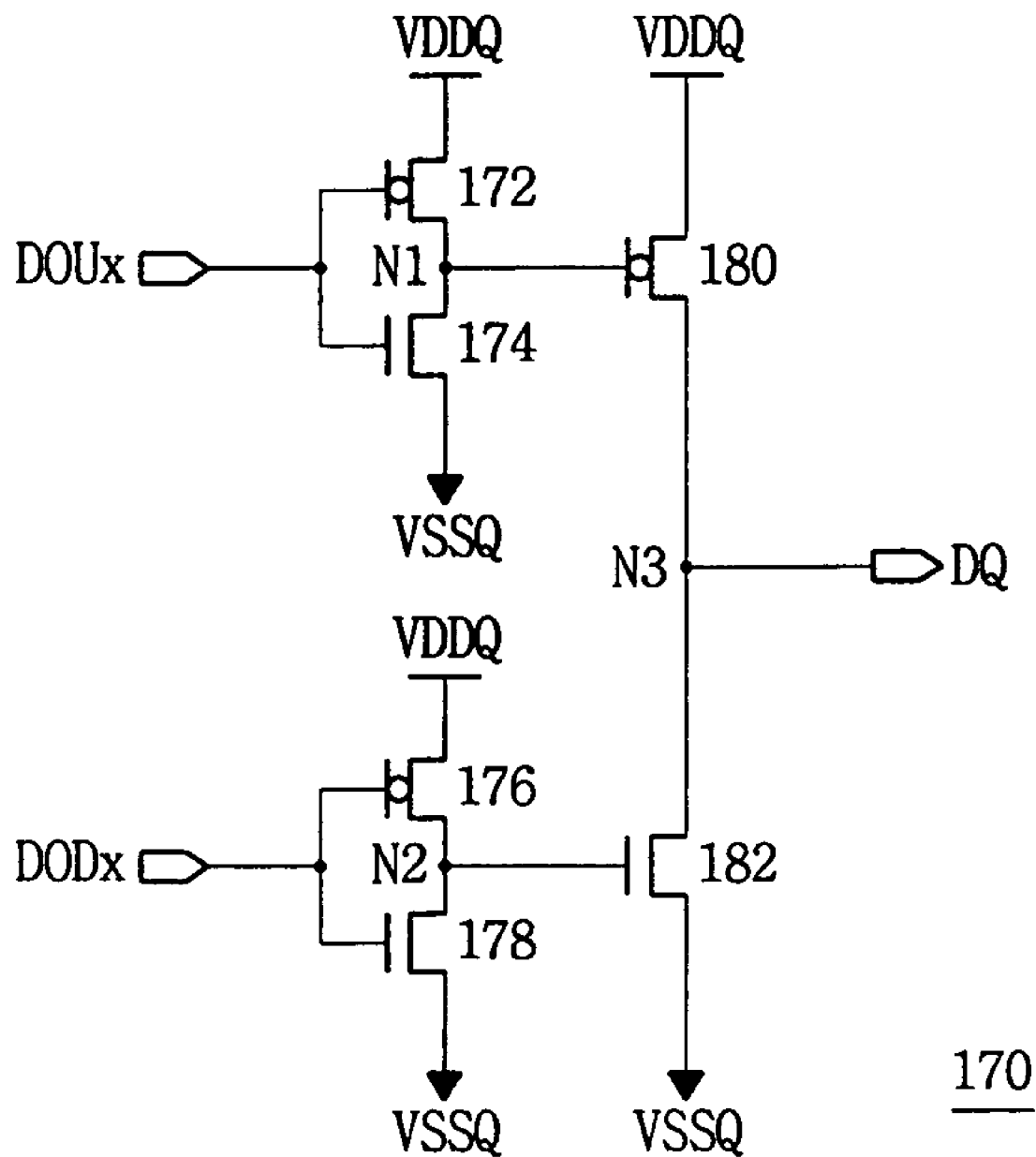
FIG. 2 is a circuit diagram showing an output driver for use in a semiconductor device in accordance with a prior art.
Figure 3:
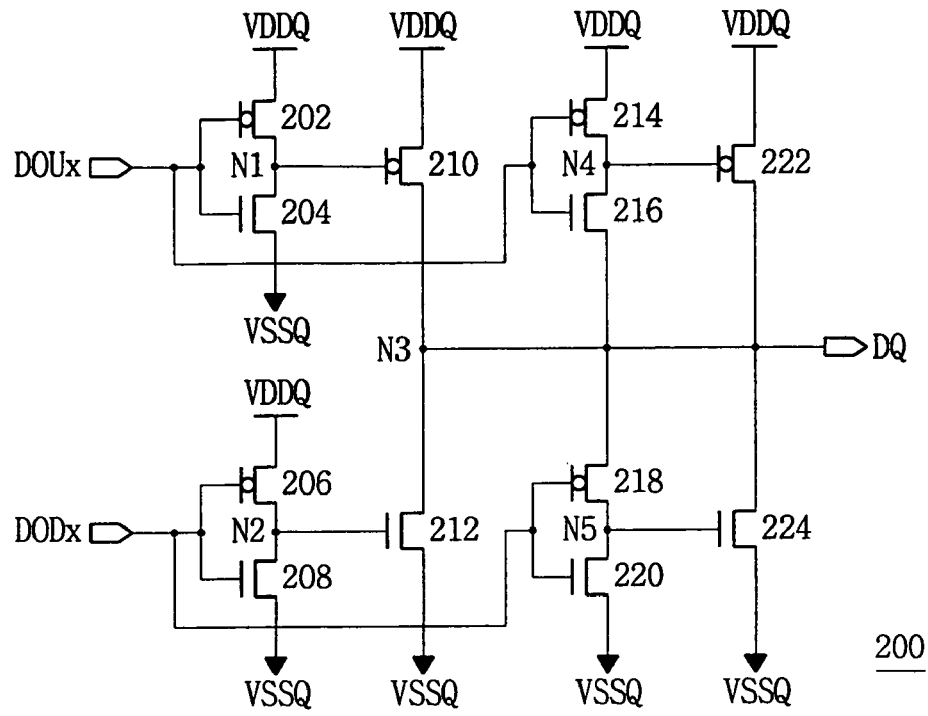
FIG. 3 is a circuit diagram showing a first driver of an output driver for use in a semiconductor device in accordance with an embodiment of the present invention.
Figure 4:
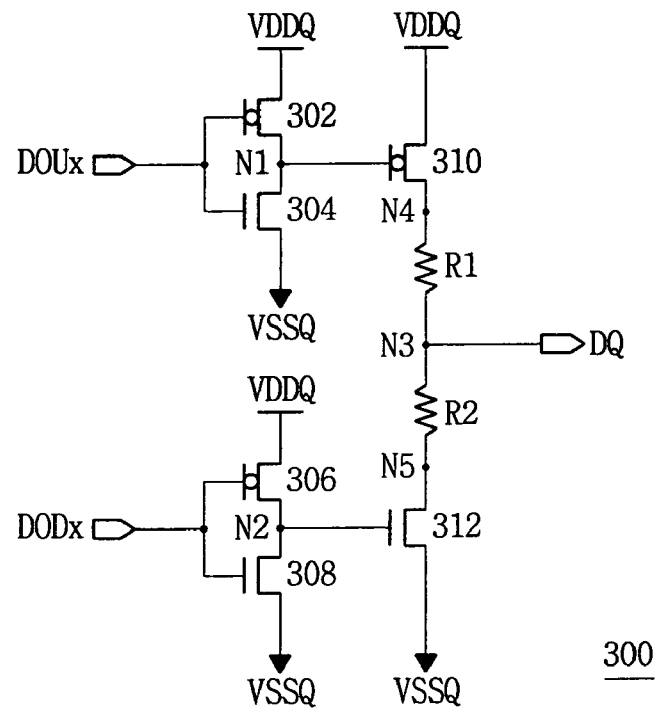
FIG. 4 is a circuit diagram showing a second driver of an output driver for use in a semiconductor device in accordance with an embodiment of the present invention.

FIG. 3 is a circuit diagram showing a first driver for a data output circuit for use in a semiconductor device in accordance with an embodiment of the present invention, and FIG. 4 is a circuit diagram showing a second driver of a data output circuit for use in a semiconductor device in accordance with an embodiment of the present invention. Referring to FIG. 3, a first driver 200 for an output driver in accordance with an embodiment of the present invention includes a pull-up driver section for reducing an impedance change for applied pull-up output data DOUx in response to the pull-up output data and providing it to an output terminal DQ, and a pull-down driving section for reducing an impedance change for applied pull-down output data DODx in response to the pull-down output data and providing it to the output terminal DQ. The pull-up driving section includes a first PMOS transistor 202 connected between a first node N1 and an external power supply VDDQ and operating in response to the applied pull-up output data DOUx, a first NMOS transistor 204 connected between the first node N1 and a ground power supply VSSQ and operating in response to the applied pull-up output data DOUx, and a third PMOS transistor 210 connected between a third node N3 connected to the output terminal DQ and the external power supply VDDQ and operating in response to a state of the first node N1. The pull-up driving section further includes a fourth PMOS transistor 214 connected between a fourth node N4 and the external power supply VDDQ and operating in response to the applied pull-up output data DOUx, a fourth NMOS transistor 216 connected between the fourth node N4 and the third node N3 and operating in response to the applied pull-up output data DOUx, and a sixth PMOS transistor 222 connected between the third node N3 and the external power supply VDDQ and operating in response to a state of the fourth node N4. The pull-down driving section includes a second PMOS transistor 206 connected between the second node N2 and the external power supply VDDQ and operating in response to the applied pull-down output data DODx, a second NMOS transistor 208 connected between the second node N2 and the ground power supply VSSQ, and a third NMOS transistor 212 connected between the third node N3 connected to the output terminal DQ and the ground power supply VSSQ and operating in response to a state of the second node N2. The pull-down driving section further includes a fifth PMOS transistor 218 connected between a fifth node N5 and the third node N3 and operating in response to the applied pull-down output data DODx, a fifth NMOS transistor 220 connected between the fifth node N5 and the ground power supply VSSQ and operating in response to the applied pull-down output data DODx, and a sixth NMOS transistor 224 connected between the third node N3 and the ground power supply VSSQ and operating in response to a state of the fifth node N5.

When the pull-up output data DOUx generated in the ZQ circuit for impedance matching is applied to the first driver 200, the first PMOS transistor 202 is turned off in response to the pull-up output data DOUx and the first NMOS transistor 204 is turned on, so that the first node N1 is in a logic "L" state. Subsequently, the third PMOS transistor 210 is turned on in response to the logic "L" state of the first node N1, so that the output data is provided to the output terminal DQ via the third node N3. Further, the fourth PMOS transistor 214 is turned off in response to the pull-up output data DOUx and the fourth NMOS transistor 216 is turned on, so that the fourth node N4 is in a logic "L" state. Subsequently, the sixth PMOS transistor 222 as the pull-up driving transistor is turned on in response to the logic "L" state of the fourth node N4 to reduce the impedance change for the output data, thereby improving linearity of the output impedance. When the pull-down output data DODx generated in the ZQ circuit for the impedance matching is applied to the first driver 200, the second PMOS transistor 206 is turned on in response to the pull-down output data DODx and the second NMOS transistor 208 is turned off, so that the second node N2 is in a logic "H" state. Subsequently, the third NMOS transistor 212 is turned on in response to the logic "H" state of the second node N2, so that the output data is provided at the output terminal DQ via the third node N3. Further, the fifth PMOS transistor 218 is turned on in response to the pull-down output data DODx and the fifth NMOS transistor 220 is turned off, so that the fifth node N5 is in the logic "H" state. Subsequently, the sixth NMOS transistor 224 is turned on in response to the logic "H" state of the fifth node N5 to reduce the impedance change for the output data, thereby improving the linearity of the output impedance.

Thus, the first driver 200 serves to allow the output impedance to be substantially maintained in a certain value as the output voltage increases, so that the change of the output impedance decreases and the linearity of the impedance is remarkably improved. However, there occurs a change of the output impedance in a region where the output voltage is less than a predetermined voltage, so that the linearity of the impedance is reduced relative to a region where the output voltage is higher than the predetermined voltage. The second driver will be subsequently described which is capable of improving the linearity of the impedance at a certain voltage or less in order to supplement such deficiency.

Referring to FIG. 4, the second driver 300 of the output driver in accordance with the embodiment of the present invention includes a first PMOS transistor 302 connected between a first node N1 and an external power supply VDDQ and operating in response to applied pull-up output data DOUx, a first NMOS transistor 304 connected between the first node N1 and a ground power supply VSSQ and operating in response to the applied pull-up output data DOUx, a third PMOS transistor 310 connected between a fourth node N4 and the external power supply VDDQ and operating in response to the first node N1, and a first resistor device R1 connected between a third node N3 connected to an output terminal DQ and the fourth node N4. The second driver 300 further includes a second PMOS transistor 306 connected between the second node N2 and the external power supply VDDQ and operating in response to applied pull-down output data DODx, a second NMOS transistor 308 connected between the second node N2 and the ground power supply VSSQ and operating in response to the pull-down output data DODx, a third NMOS transistor 312 connected between a fifth node N5 and the ground power supply VSSQ and operating in response to a state of the second node N2, and a second resistor device R2 connected between the third node N3 connected to the output terminal Dq and the fifth node N5.

When the pull-up output data DOUx generated in a ZQ circuit for impedance matching is applied to the first driver 300, the first PMOS transistor 302 is turned off in response to the pull-up output data DOUx and the first NMOS transistor 304 is turned on, so that the first node N1 is in a logic "L" state. Subsequently, the third PMOS transistor 310 is turned on in response to the logic "L" state of the first node N1, which allows the impedance of the output data to be maintained in a certain value by the first resistor device R1. When the pull-down output data DODx generated in the ZQ circuit for the impedance matching is applied to the second driver 300, the second PMOS transistor 306 is turned on in response to the pull-down output data DODx and the second NMOS transistor 308 is turned off, so that the second node N2 is in a logic "H" state. Subsequently, the third NMOS transistor 312 is turned on in response to the logic "H" state of the second node N2, which allows the impedance of the output data to be maintained in a certain value by the second resistor device R2.

Thus, the second driver 300 improves the linearity of the impedance by allowing the output impedance to be maintained in a certain value to decrease the change of the output impedance even though the output voltage increases. However, in order to match with an external impedance, sizes of third PMOS and third NMOS transistors 310 and 312 being driving transistors should be increased in proportion to a size of the external impedance, and as a size of the driving transistor increases, a switching current increases, resulting in increase in capacitance.

Hereinafter, description will be given on an output driver in accordance with an embodiment of the present invention, in which both an advantage of the first driver of a diode type that compensates for the impedance change for the output data due to the change of the external power supply voltage, and an advantage of the second driver of the resistor type capable of reducing the impedance change without remarkably increasing the capacitance and being formed in a small size are obtained, and a disadvantage of the first driver in that the linearity of the impedance is degraded at a certain voltage or less, and a disadvantage of the second driver in that the driver increases in size and in turn a capacitance increases are cancelled by each other.

Figure 5:
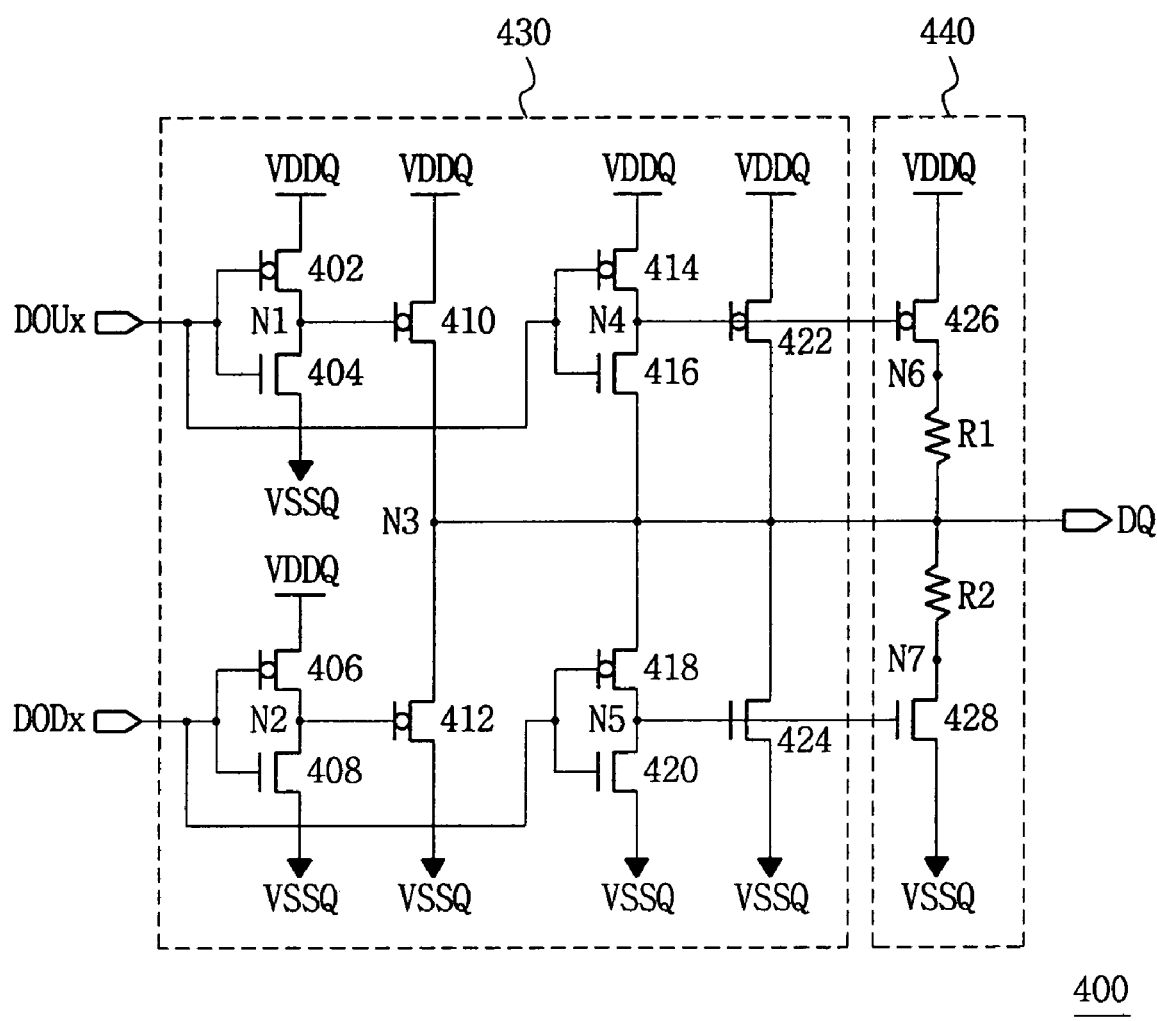
FIG. 5 is a circuit diagram showing an output driver for use in a semiconductor device in accordance with an embodiment of the present invention.

FIG. 5 is a circuit diagram showing an output driver in a semiconductor device in accordance with an embodiment of the present invention. A detailed configuration and operation will be described with reference to FIG. 5.

Referring to FIG. 5, an output driver 400 for use in a semiconductor device in accordance with an embodiment of the present invention includes a first driving section 430 of a diode type for reducing an impedance change for the output data in response to states of applied output data DOUx and DODx and providing an output terminal DQ with the impedance change for the output data, and a second driving section 440 of a resistor type for reducing the impedance change for the output data and providing the output terminal DQ with the output data.

The first driving section 430 includes a first pull-up driving section for reducing the impedance change for the output data in response to the applied pull-up output data DOUx and providing the output terminal DQ with the output data, and a first pull-down driving section for reducing the impedance change for the output data in response to the applied pull-down output data DODx, and providing the output terminal DQ with the output data. The first pull-up driving section includes a first PMOS transistor 402 connected between a first node N1 and an external power supply VDDQ and operating in response to the applied pull-up output data DOUx, a first NMOS transistor 404 connected between the first node N1 and the ground power supply VSSQ and operating in response to the applied pull-up output data DOUx, and a third PMOS transistor 410 connected between a third node N3 connected to the output terminal DQ and the external power supply VDDQ and operating in response to a state of the first node N1. The first pull-up driving section further includes a fourth PMOS transistor 414 connected between a fourth node N4 and the external power supply VDDQ and operating in response to the applied pull-up output data DOUx, a fourth NMOS transistor 416 connected between the fourth node N4 and the third node N3 and operating in response to the applied pull-up output data DOUx, and a sixth PMOS transistor 422 connected between the third node N3 and the external power supply VDDQ and operating in response to a state of the fourth node N4. The first pull-down driving section includes a second PMOS transistor 406 connected between the second node N2 and the external power supply VDDQ and operating in response to the applied pull-down output data DODx, a second NMOS transistor 408 connected between the second node N2 and the ground power supply VSSQ and operating in response to the applied pull-down output data DODx, and a third NMOS transistor 412 connected between the third node N3 connected to the output terminal DQ and the ground power supply VSSQ and operating in response to the state of the second node N2. The first pull-down driving section further includes a fifth PMOS transistor 418 connected between the fifth node N5 and the third node N3 and operating in response to the applied pull-down output data DODx, a fifth NMOS transistor 420 connected between the fifth node N5 and the ground power supply VSSQ and operating in response to the applied pull-down output data DODx, and a sixth NMOS transistor 424 connected between the third node N3 and the ground power supply VSSQ and operating in response to a state of the fifth node N5.

The second driving section 440 includes a second pull-up driving section for reducing the impedance change for the data outputted from the first driving section in response to a state of the fourth node N4 in the first pull-up driving section and providing the output terminal DQ with the output data, and a second pull-down driving section for reducing the impedance change for the data outputted from the first driving section in response to the state of the fifth node in the first driving section and providing the output terminal DQ with the output data. The second full-up driving section includes a seventh PMOS transistor 426 connected between a sixth node N6 and the external power supply VDDQ and operating in response to the state of the fourth node N4 of the first pull-up driving section, and a first resistor device R1 connected between the third node N3 connected to the output terminal DQ and the sixth node N6. The second pull-down driving section further includes a seventh NMOS transistor 428 connected between a seventh node N7 and the ground power supply VSSQ and operating in response to the state of the fifth node N5 of the first pull-down driving section and a second resistor device R2 connected between the third node N3 connected to the output terminal DQ and the seventh node N7.

Next, operation of the output driver in accordance with the embodiment of the present invention having the configuration as described above will be described.

First, when the pull-up output data DOUx generated in the ZQ circuit for the impedance matching is applied to the output driver 400, the first PMOS transistor 402 is turned off in response to the pull-up output data DOUx and the first NMOS transistor 404 is turned on, so that the first node N1 is in a logic "L" state. Subsequently, the third PMOS transistor 410 is turned on in response to the logic "L" state of the first node N1, so that the output data is provided to the output terminal DQ via the third node N3. Further, the fourth PMOS transistor 414 is turned off in response to the pull-up output data DOUx and the fourth NMOS transistor 416 is turned on, so that the fourth node N4 is in a logic "L" state. Subsequently, the sixth PMOS transistor 422 being a pull-up driving transistor is turned on in response to the logic "L" state of the fourth node N4 to reduce the impedance change for the output data, thereby improving the linearity of the output impedance. Then, the seventh PMOS transistor 426 is turned on in response to the logic "L" state of the fourth node N4 to compensate for the output impedance change in a certain voltage or less using the first resistor device R1, thereby improving the linearity of the output impedance over all regions upon a pull-up operation.

When the pull-down output data DODx generated in the ZQ circuit for the impedance matching is applied to the output driver 400, the second PMOS transistor 406 is turned on in response to the pull-down output data DODx and the second NMOS transistor 408 is turned off, so that the second node N2 is in the logic "H" state. Subsequently, the third NMOS transistor 412 is turned on in response to the logic "H" state of the second node N2, so that the output data DQ is provided to the output terminal DQ through the third node N3. Further, the fifth PMOS transistor 418 is turned on in response to the pull-down output data DODx and the fifth NMOS transistor 420 is turned off, so that the fifth node N5 is in the logic "H" state. Subsequently, the sixth NMOS transistor 424 is turned on in response to the logic "H" state of the fifth node N5 to reduce the impedance change for the output data, thereby improving the linearity of the output impedance. Then, the seventh NMOS transistor 428 is turned on in response to the logic "H" state of the fifth node N5 to compensate the output impedance change in a certain voltage or less using the second resistor device R2, thereby the linearity of the output impedance over all regions upon the pull-up operation.

Figure 6:
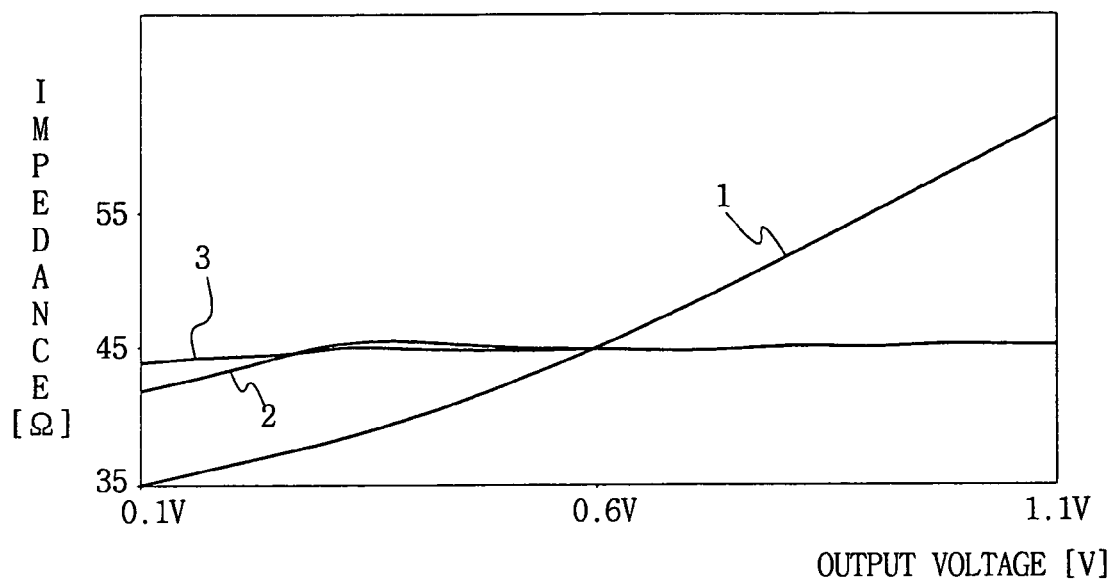
FIG. 6 is a graph showing a relationship between an output voltage and an output impedance upon a pull-up operation of an output driver in accordance with an embodiment of the present invention.
Figure 7:
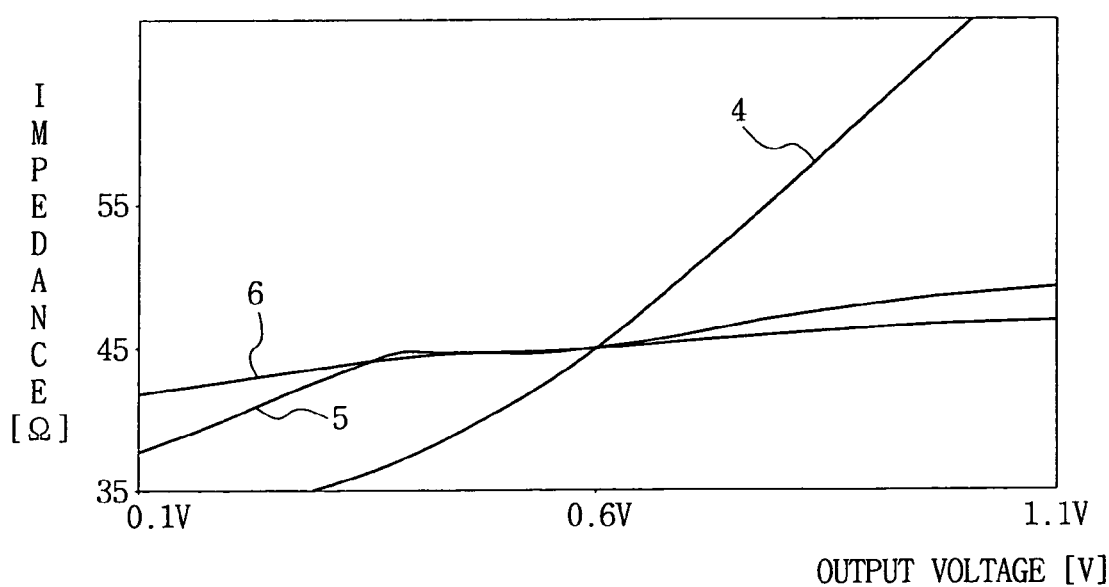
FIG. 7 is a graph showing a relationship between an output voltage and an output impedance upon a pull-down operation of an output driver in accordance with an embodiment of the present invention.

FIG. 6 is a graph showing a relationship between an output voltage and output impedance upon a pull-up operation of an output driver in accordance with an embodiment of the present invention, and FIG. 7 is a graph showing a relationship between an output voltage and output impedance upon a pull-down is operation of an output driver in accordance with an embodiment of the present invention. The graphs show results when simulation is carried out at a temperature condition of 25° C. in which an external power supply voltage VDDQ of 1.2V is applied to the output driver, where an abscissa axis denotes an output voltage [V] and an ordinate axis denotes an output impedance [Ω].

As shown in FIG. 6, upon a pull-up operation, the output impedance of an output driver 1 in accordance with a prior art increases in proportion to an increase of the output voltage while the output impedance of an output driver 2 including a first driver of a diode type in accordance with the present invention is substantially uniform as the output voltage increases, such that the change of output impedance is remarkably reduced. However, the change of the output impedance occurs in a region where the output voltage is less than about 0.4V, so that the linearity of the impedance is relatively degraded as compared with a region where the output voltage is higher than about 0.4V. In the case of an output driver 3 including a first driver of a diode type and a second driver of a resistor type in accordance with the present invention, it is shown that the output impedance is uniform as the output voltage increases, and the linearity of the impedance is remarkably improved even in the region where the output voltage is less than about 0.4V, in which the linearity of the impedance is relatively degraded.

As shown in FIG. 7, upon a pull-down operation, the output impedance of an output driver 4 in accordance with the prior art increases in proportion to an increase of the output voltage while the output impedance of an output driver 5 including a first driver of a diode type in accordance with the present invention is substantially uniform as the output voltage increases, thereby remarkably reducing the change in the output impedance. However, the change of the output impedance occurs in a region where the output voltage is less than about 0.4V, so that the linearity of the impedance is relatively reduced as compared with the region where the output voltage is higher than about 0.4V, as in FIG. 6. In the case of an output driver 6 including the first driver of a diode type and the second driver of a resistor type in accordance with the present invention, it is shown that the output impedance is uniform as the output voltage increases, and the linearity of the impedance is remarkably improved even in the region where the output voltage is less than about 0.4V, in which the linearity of the impedance has been relatively degraded.

As described above, according to the output driver of the embodiment of the present invention, it is possible to remarkably reduce the impedance change for the output data by including the first driving section of a diode type which compensates for the impedance change for the output data caused by the change of the external power supply voltage. Further, it is possible to reduce the impedance change without remarkably increasing capacitance, to reduce a size of the output driver by including the second driving section of a resistor type which can be formed with a small size, and to further reduce the impedance change over all regions without increasing the capacitance of the output driver, compared with prior art. In particular, the second driving section can improve the linearity of the impedance over all regions by the first driving section supplementing the degradation of the impedance linearity at a certain voltage or less. Thus, the present invention is characterized in that the linearity of the impedance can be remarkably improved by minimizing the impedance change for the output data without increasing capacitance of the output driver.

It will be apparent to those skilled in the art that the output driver in the semiconductor device in accordance with the embodiment of the present invention is not limited to the embodiment, and a variety of variations and modifications may be made to the present invention within the technical spirit of the present invention. For example, the semiconductor device can be applied to various semiconductor devices as well as an SRAM, and can be composed of an output driver including a plurality of first and second driving sections in accordance with an impedance matching step and the number of the output data.

As described above, there is an advantage associated with the invention that an impedance change for output data is remarkably reduced by including a first driving section of a diode type which compensates for the impedance change for the output data caused due to a change of an external power supply voltage.

There is another advantage that the impedance change can be reduced without remarkably increasing capacitance, a size of an output driver can be reduced by including a second driving section of a resistor type which can be formed with a small size, and the impedance change can be reduced over all regions without increasing capacitance of the output driver, compared with a prior art.

The present invention has an advantage that the linearity of the impedance can be remarkably improved by minimizing the impedance change for the output data without increasing capacitance of the output driver.

What is claimed is:

1. An output driver for outputting internal data of a semiconductor device to the exterior of a chip, comprising:
   a first driving section including a driving transistor to maintain an impedance for applied data at a level in response to the data; and
   a second driving section for compensating for linearity of the impedance in response to an operation signal from the driving transistor of the first driving section and providing an output terminal with the data, wherein the second driving section includes a resistor device for compensating for linearity of the impedance in response to an operation signal from the driving transistor of the first driving section.

2. The output driver according to claim 1, wherein the first driving section is of a diode type for maintaining an impedance for output data dependent on a change of an output voltage at a level.

3. The output driver according to claim 1, wherein the first driving section includes:
   a first pull-up driving section for maintaining the impedance of applied pull-up output data at a level in response to the pull-up output data; and
   a first pull-down driving section for maintaining an impedance of applied pull-down output data at a level in response to the pull-down output data.

4. The output driver according to claim 3, wherein the first pull-up driving section includes:
   a first PMOS transistor connected between a first node and an external power supply and operating in response to the applied pull-up output data;
   a first NMOS transistor connected between the first node and a ground power supply and operating in response to the applied pull-up output data;
   a third PMOS transistor connected between a third node connected to an output terminal and the external power supply and operating in response to a state of the first node;
   a fourth PMOS transistor connected between a fourth node and the external power supply and operating in response to the applied pull-up output data;
   a fourth NMOS transistor connected between the fourth node and the third node and operating in response to the applied pull-up output data; and
   a sixth PMOS transistor connected between the third node and the external power supply and operating in response to a state of the fourth node.

5. The output driver according to claim 3, wherein the first pull-down driving section includes:
   a second PMOS transistor connected between the second node and the external power supply and operating in response to the applied pull-down output data;
   a second NMOS transistor connected between the second node and the ground power supply and operating in response to the applied pull-down output data;
   a third NMOS transistor connected between the output terminal and the ground power supply and operating in response to a state of the second node;
   a fifth PMOS transistor connected between the fifth node and the third node and operating in response to the applied pull-down output data;
   a fifth NMOS transistor connected between the fifth node and the ground power supply and operating in response to the pull-down output data; and
   a sixth NMOS transistor connected between the third node and the ground power supply and operating in response to a state of the fifth node.

6. The output driver according to claim 1, wherein the second driving section includes:
   a second pull-up driving section for compensating for linearity of the impedance in response to a state of a fourth node of the first driving section and providing the output terminal with the data; and
   a second pull-down driving section for compensating for linearity of the impedance in response to a state of a fifth node of the first driving section and providing the output terminal with the data.

7. The output driver according to claim 6, wherein the second pull-up driving section includes:
   a PMOS transistor connected between the sixth node and the external power supply and operating in response to the state of the fourth node of the first driving section; and
   a first resistor device connected between the third node connected to the output terminal and the fifth node.

8. The output driver according to claim 6, wherein the second pull-down driving section includes:
   an NMOS transistor connected between the sixth node and the ground power supply and operating in response to the state of the fifth node of the first driving section; and
   a second resistor device connected between the third node connected to the output terminal and the seventh node.

9. The output driver according to claim 1, wherein the semiconductor device is an SRAM device.

10. The output driver according to claim 1, wherein the output driver is an off-chip driver for providing the output terminal with output data of a ZQ circuit applied for impedance matching of the semiconductor device.

11. An output driver for outputting internal data of a semiconductor device to the exterior of a chip, comprising:
a first driving section including a driving transistor to maintain an impedance for applied data at a level in response to the data, wherein the first driving section includes:
  a first pull-up driving section for maintaining the impedance of applied pull-up output data at a level in response to the pull-up output data, wherein the first pull-up driving section includes:
    a first PMOS transistor connected between a first node and an external power supply and operating in response to the applied pull-up output data;
    a first NMOS transistor connected between the first node and a ground power supply and operating in response to the applied pull-up output data;
    a third PMOS transistor connected between a third node connected to an output terminal and the external power supply and operating in response to a state of the first node;
    a fourth PMOS transistor connected between a fourth node and the external power supply and operating in response to the applied pull-up output data;
    a fourth NMOS transistor connected between the fourth node and the third node and operating in response to the applied pull-up output data; and
    a sixth PMOS transistor connected between the third node and the external power supply and operating in response to a state of the fourth node;
  a first pull-down driving section for maintaining an impedance of applied pull-down output data at a level in response to the pull-down output data; and
a second driving section for compensating for linearity of the impedance in response to an operation signal from the driving transistor of the first driving section and providing an output terminal with the data.

12. An output driver for outputting internal data of a semiconductor device to the exterior of a chip, comprising:
a first driving section including a driving transistor to maintain an impedance for applied data at a level in response to the data, wherein the first driving section includes:
  a first pull-up driving section for maintaining the impedance of applied pull-up output data at a level in response to the pull-up output data; and
  a first pull-down driving section for maintaining an impedance of applied pull-down output data at a level in response to the pull-down output data, wherein the first pull-down driving section includes:
    a second PMOS transistor connected between the second node and the external power supply and operating in response to the applied pull-down output data;
    a second NMOS transistor connected between the second node and the ground power supply and operating in response to the applied pull-down output data;
    a third NMOS transistor connected between the output terminal and the ground power supply and operating in response to a state of the second node;
    a fifth PMOS transistor connected between the fifth node and the third node and operating in response to the applied pull-down output data;
    a fifth NMOS transistor connected between the fifth node and the ground power supply and operating in response to the pull-down output data; and
    a sixth NMOS transistor connected between the third node and the ground power supply and operating in response to a state of the fifth node; and
a second driving section for compensating for linearity of the impedance in response to an operation signal from the driving transistor of the first driving section and providing an output terminal with the data.

13. An output driver for outputting internal data of a semiconductor device to the exterior of a chip, comprising:
a first driving section including a driving transistor to maintain an impedance for applied data at a level in response to the data; and
a second driving section for compensating for linearity of the impedance in response to an operation signal from the driving transistor of the first driving section and providing an output terminal with the data, wherein the second driving section includes:
  a second pull-up driving section for compensating for linearity of the impedance in response to a state of a fourth node of the first driving section and providing the output terminal with the data, wherein the second pull-up driving section includes:
    a PMOS transistor connected between the sixth node and the external power supply and operating in response to the state of the fourth node of the first driving section; and
    a first resistor device connected between the third node connected to the output terminal and the fifth node; and
  a second pull-down driving section for compensating for linearity of the impedance in response to a state of a fifth node of the first driving section and providing the output terminal with the data.

14. An output driver for outputting internal data of a semiconductor device to the exterior of a chip, comprising:
a first driving section including a driving transistor to maintain an impedance for applied data at a level in response to the data; and
a second driving section for compensating for linearity of the impedance in response to an operation signal from the driving transistor of the first driving section and providing an output terminal with the data, wherein the second driving section includes:
  a second pull-up driving section for compensating for linearity of the impedance in response to a state of a fourth node of the first driving section and providing the output terminal with the data; and
  a second pull-down driving section for compensating for linearity of the impedance in response to a state of a fifth node of the first driving section and providing the output terminal with the data, wherein the second pull-down driving section includes:
    an NMOS transistor connected between the sixth node and the ground power supply and operating in response to the state of the fifth node of the first driving section; and
    a second resistor device connected between the third node connected to the output terminal and the seventh node.

* * * * *